(12) United States Patent
Arai

(10) Patent No.: US 7,069,566 B2
(45) Date of Patent: Jun. 27, 2006

(54) OPTICAL DISK APPARATUS HAVING A PLURALITY OF DRAWER DETECTION SENSORS

(75) Inventor: Kuniaki Arai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 333 days.

(21) Appl. No.: 10/755,378

(22) Filed: Jan. 13, 2004

(65) Prior Publication Data

US 2004/0148616 A1    Jul. 29, 2004

(30) Foreign Application Priority Data

Jan. 27, 2003    (JP)    ............................. 2003-017536

(51) Int. Cl.
G11B 17/03    (2006.01)
(52) U.S. Cl. ...................................... 720/606
(58) Field of Classification Search ................ 720/606; 369/75.1, 75.11, 75.2, 75.21, 77.1, 77.11, 369/77.2, 77.21
See application file for complete search history.

(56) References Cited

U.S. PATENT DOCUMENTS 5,784,350 A * 7/1998 Akiba et al. ................ 720/606
6,426,873 B1 * 7/2002 Minase et al. .............. 361/686
2004/0027962 A1 * 2/2004 Kabasawa ................... 369/75.2

FOREIGN PATENT DOCUMENTS

JP    5-135397    6/1993

* cited by examiner

Primary Examiner—Allen Cao
(74) Attorney, Agent, or Firm—Dickstein Shapiro Morin & Oshinsky LLP

(57) ABSTRACT

An optical disk apparatus has a plurality of detection switches for improving safety while a mounting area is prevented from being occupied by the detection switches. A cabinet member accommodates component parts of the optical disk apparatus including a circuit board having control circuits that control various functions of the optical disk apparatus. A drawer member is movable between an accommodated position where the drawer member is accommodated in the cabinet member and a non-accommodated position where the drawer member is out of the cabinet member. An optical pickup is mounted on the drawer member so as to emit the laser beam toward the optical disk placed on the placement part. A plurality of drawer member detection switches are provided to detect a position of the drawer member. The drawer member detection switches are arranged on opposite sides of the circuit board in a state where the drawer member detection switches face each other with the circuit board located therebetween.

10 Claims, 7 Drawing Sheets

OPTICAL DISK APPARATUS HAVING A PLURALITY OF DRAWER DETECTION SENSORS

BACKGROUND OF THE INVENTION

1. Field of the Invention

The present invention generally relates to optical disk apparatuses and, more particularly, to an optical disk apparatus, which records/reproduces information on/from an optical disk by irradiating a laser beam onto the optical disk, and has a drawer detection switch for detecting a state of a drawer having a placement part on which the optical disk is placed.

2. Description of the Related Art

Generally, an optical disk apparatus comprises: a cabinet accommodating a circuit board on which control circuits providing various functions necessary for the apparatus are mounted; and a drawer slidable within the cabinet between a loaded position and an unloaded position and having an optical pickup and a placement part on which an optical disk is placed. A semiconductor laser (a laser diode: LD) is used as an illuminant provided in an optical pickup. In order to protect a user from being exposed to a laser beam, the semiconductor laser is controlled by a controlling means so that the semiconductor laser is turned off when the drawer is at the unloaded position.

However, if some troubles arise in the control means for controlling on/off of the semiconductor laser, the semiconductor laser may emit a laser beam even when the drawer is out of the apparatus, that is, the drawer is at the unloaded position with respect to the cabinet. In such a case, it is possible that a laser beam unnecessarily emitted by the semiconductor laser enters user's eyes and the user becomes blind in the worst case.

In order to eliminate such a problem, Japanese Laid-Open Patent Application No. 5-135397 discloses an optical disk apparatus, which aims to protect a user from a laser beam. The optical disc apparatus disclosed in this patent document uses a detection switch for detecting existence of a cartridge accommodating an optical disk and an electronic circuit for maintaining safety. The optical disk apparatus may use a plurality of detection switches to improve safety.

However, using the special electronic circuit for improving safety as mentioned above leads to an increase in the cost of the optical disc apparatus. Moreover, using a plurality of detection switches to detect a state of the drawer leads to occupancy of a limited mounting area in the circuit board.

SUMMARY OF THE INVENTION

It is a general object of the present invention to provide an optical disk apparatus in which the above-mentioned problems are eliminated.

A more specific object of the present invention is to provide an optical disk apparatus having a plurality of detection switches for improving safety while a mounting area is prevented from being occupied by the detection switches.

In order to achieve the above-mentioned objects, there is provided according to the present invention an optical disk apparatus for recording and/or reproducing information on an optical disk by irradiating a laser beam onto the optical disk, the optical disk apparatus comprising: a cabinet member that accommodates component parts of the optical disk apparatus including a circuit board having control circuits that control various functions of the optical disk apparatus; a drawer member having a placement part on which the optical disk is placed, the drawer member being movable between an accommodated position where the drawer member is accommodated in the cabinet member and a non-accommodated position where the drawer member is out of the cabinet member; an optical pickup mounted on the drawer member so as to emit the laser beam toward the optical disk placed on the placement part; and a plurality of drawer member detection switches each of which detects a position of the drawer member, the drawer member detection switches being arranged on opposite sides of the circuit board in a state where the drawer member detection switches face each other with the circuit board located therebetween.

According to the present invention, the two drawer member detection switches are mounted on both side of the circuit board one on each side so that the switches are opposite to each other with the circuit board located therebetween. Thus, an area for mounting the drawer member detection switches on the circuit board is reduced as compared to a case where a plurality of drawer member detection switches are mounted on the same side of the circuit board. Thus, the limited mounting area of the circuit board can be used efficiently.

In the optical disk apparatus according to the present invention, a coupling member may be connected to both the drawer member detection switches arranged opposite to each other with the circuit board therebetween so as to interlock switching operations of the drawer member detection switches with each other. Accordingly, there is no need to provide a plurality of operation members to individually operate the drawer member detection switches. Thus, a mechanism to operate the drawer member detection switches can be simplified and miniaturized.

Additionally, the drawer member may have an operation member that presses the coupling member when the drawer member moves to the accommodated position. Accordingly, the drawer member detection switches can be operated by an action of a single operation member.

Further, a guiding part may be provided in the cabinet member so as to guide a movement of the operation member. Accordingly, the operation member is movable toward the coupling member without interference with other parts in the vicinity of the drawer member detection switches, which assures a reliable operation of the drawer member detection switches. The guiding part may be a protrusion formed on a side edge of the circuit board.

Additionally, in the optical disk apparatus according to the present invention, each of the drawer member detection switches may have at least one positioning pin that protrudes from a surface facing the circuit board, and the positioning pin of one of the drawer member detection switches opposite to each other with the circuit board located therebetween is located at a position different from a position of the positioning pin of the other one of the drawer member detection switches opposite to each other with the circuit board located therebetween.

Accordingly, the positioning pins of the drawer member detection switches opposite to each other with the circuit board located therebetween protrude into the circuit board at different positions. Thus, if the thickness of the circuit board is smaller than a sum of lengths of the positioning pins protruding from opposite sides, the drawer member detection switches can be mounted on both sides of the circuit board without interference of the positioning pins with each other.

Other objects features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of some embodiments of the present invention.

Figure 1:
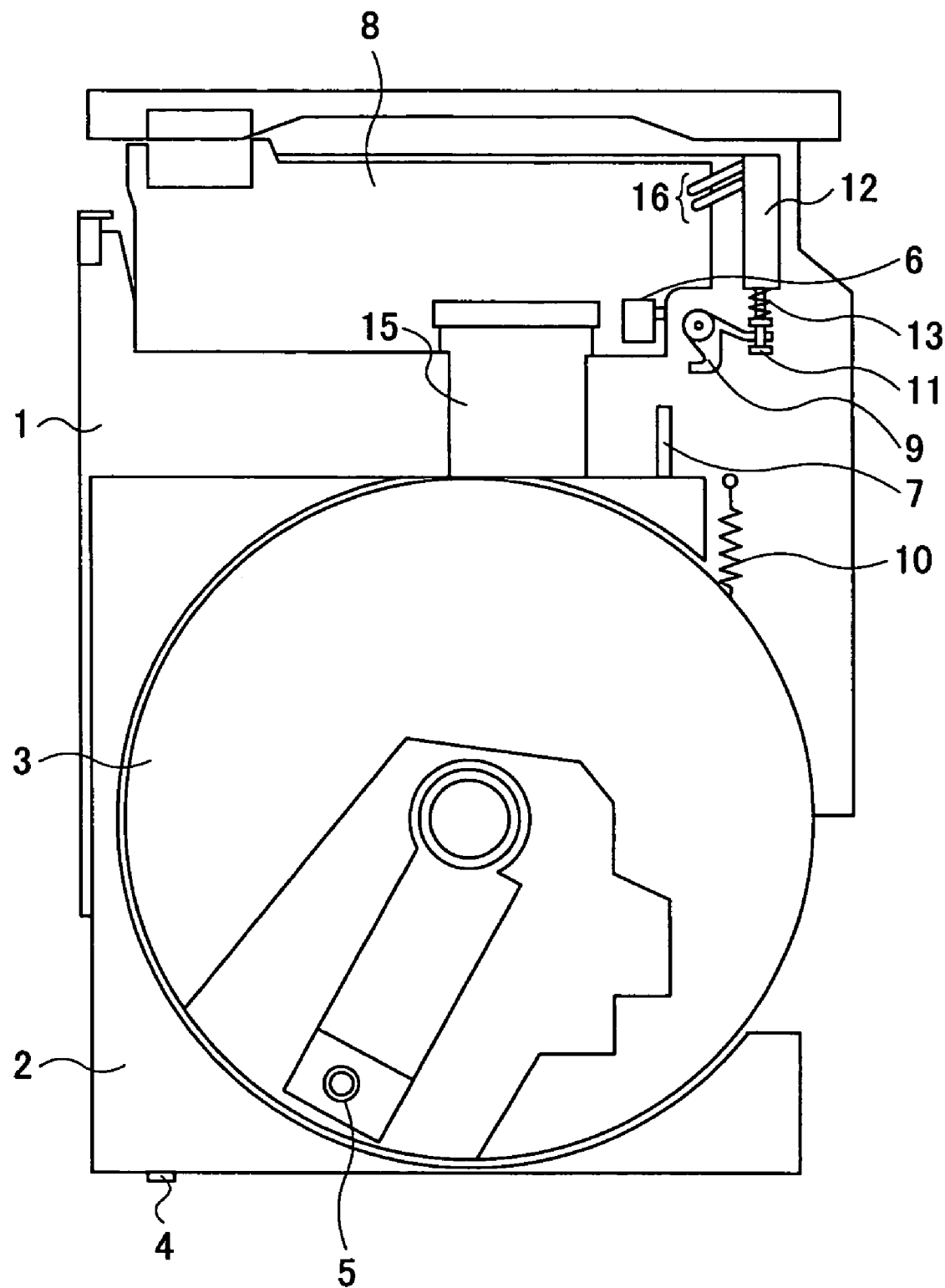
FIG. 1 is a plan view of a part of a compact optical disk apparatus to which the present invention is applicable.

FIG. 1 is a plan view showing a part of a compact optical disk apparatus to be mounted to a small personal computer (PC) such as a notebook type personal computer. Structural components of the optical disk apparatus shown in FIG. 1 are divided roughly into parts of a cabinet member 1 and parts of a drawer member 2.

In FIG. 1, the drawer member 2 comprises a disk placement part 3, an eject button 4, an optical pickup 5 and an operation member 7. The disk placement part 3 is provided for placing an optical disk thereon. The eject button 4 is pressed when moving the drawer member 2 into or out of the cabinet member 1. The optical pickup 5 has a semiconductor laser (laser diode (LD) not shown in the figure) so as to irradiate a laser beam emitted by the semiconductor laser onto an optical disk to perform recording/reproduction of information on the optical disk. The operation member 7 operates a drawer member detection switch 6 provided in the cabinet member 1 as mentioned later.

The drawer member 2 is movable between an accommodated position where the drawer member 2 is located inside the cabinet member 1 and a non-accommodated position where the drawer member 2 is out of the cabinet member 1. The operation member 7 performing a switching operation with respect to the drawer member detection switch 6 is configured and arranged to press the drawer member detection switch 6 when the drawer member 2 is at the accommodated position. On the other hand, operation member 7 does not press the drawer member detection switch 6 when the drawer member 2 is at the non-accommodated position.

Besides the drawer member detection switch 6, the cabinet member 1 comprises circuit board 8, an engagement claw arm 9, a spring 10, a plunger 11, a solenoid device 12 and a return spring 13. The circuit board 8 has control circuits including a central processing unit (CPU) for controlling various kinds of functions such as a mechanical part controlling function, a signal modulating and demodulating function, etc. The engagement claw arm 9 constitutes a drawer member locking mechanism, which is engageable with and disengageable from a part of the drawer member 2. The spring 10 constitutes a drawer member ejecting mechanism. The plunger 11 constitutes a drawer member releasing mechanism, which engages with a part of the engagement claw arm 9 so as to drive the engagement claw arm 9. The plunger 11 is driven by the solenoid device 12, and returned by the return spring 13.

It should be noted that, in FIG. 1, a flexible printed circuit board (FPC) 15 electrically connects the circuit board 8 to a circuit board (not shown in the figure) provided in the drawer member 2, and a lead wire 16 electrically connects the circuit board 8 to the solenoid device 12.

The optical disk apparatus shown in FIG. 1 is in the state where the drawer member 2 is at the non-accommodated position. The solenoid device 12 is turned on by pressing the eject button 4, which causes the plunger 11 to be an attracted state. Accordingly, the engagement claw arm 9 rotates so that the engagement claw arm 9 is disengaged from the drawer member 2. After the engagement claw arm 9 rotates, the drawer member 2 moves out of the cabinet member 1 due to an urging force of the spring 10. Thereby, it becomes possible to exchange a disk in the drawer member 2 or set a disk on the disk placement part 3.

The drawer member 2 can be moved to the accommodated position from this position by drawing the drawer member 2 into the cabinet member 1 by a drive mechanism (not shown in the figure) by pressing the eject button 4. In the state where the drawer member 2 is completely accommodated in the cabinet member 1, the solenoid device 12 is turned off. Thereby, the engagement claw arm 9 is engaged with the drawer member 2 again, which causes the drawer member 2 in a locked state.

A description will now be given, with reference to FIGS. 1 and 2, of an example of an LD control according to the drawer member detection switch 6 when the drawer member 2 is at the non-accommodated position.

Figure 2:
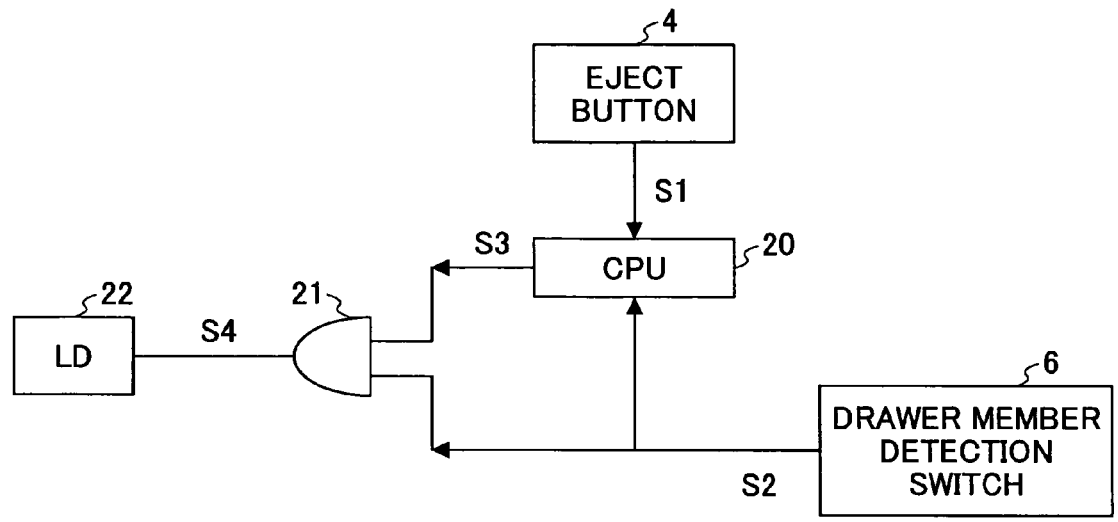
FIG. 2 is a block diagram of an example of a semiconductor laser control system of the optical disc apparatus according to the present invention.

In FIG. 2, the CPU (central processing unit) 20 and the AND circuit 21 are mounted on the circuit board 8, and the semiconductor laser (LD) of the optical pickup 5 is connected to the AND circuit 21. It should be noted that, in the following description, it is assumed that a high-level signal is a detection/drive signal and a low-level signal is a non-detection/non-drive signal.

When the eject button 4 is pressed, a signal (high-level signal) S1, which indicates that the eject button 4 is pressed, is output from the eject button 4. The CPU 20 receives the signal S1 and outputs a signal S3 of a low level. Accordingly, a low level signal (LD non-drive signal) S4 is output from the AND circuit 21. That is, if one of the two inputs of the AND circuit 21 is a low-level signal, an output of the AND circuit 21 is a low-level signal. Thereby, the semiconductor laser (LD) 22 is not driven.

A description will be given below of a case where the CPU 20 does not operate normally and a high-level signal is output from the CPU 20 instead of the low-level signal S3. At a moment when the eject button is pressed, a signal S2 output from the drawer member detection switch 6 is a high-level signal since the drawer member 2 is accommodated inside the cabinet member 1. Therefore, the high-level signal (LD drive signal) S4 is output to the semiconductor laser (LD) 22. However, since the eject button 4 is pressed, the drawer member 2 moves from the accommodated position to the non-accommodated position. With this movement of the drawer member 2, the drawer member detection switch 6 is turned off, thereby changing the signal S2 from the high-level signal to a low-level signal. Accordingly, the low-level signal (LD non-drive signal) S4 is output to the semiconductor laser (LD) 22. Therefore, the semiconductor laser (LD) 22 does not emit a laser beam when the drawer member 2 is at the non-accommodated position even if the CPU does not operate normally.

However, in a case where the CPU 20 does not operate normally and also the drawer member detection switch 6 is out of order, it is possible that the semiconductor laser (LD) 22 emits a laser beam when the drawer member is at the non-accommodated position. In order to eliminate such a problem, the optical disk apparatus according to the present embodiment is provided with a plurality of drawer member detection switches 6.

Figure 3:
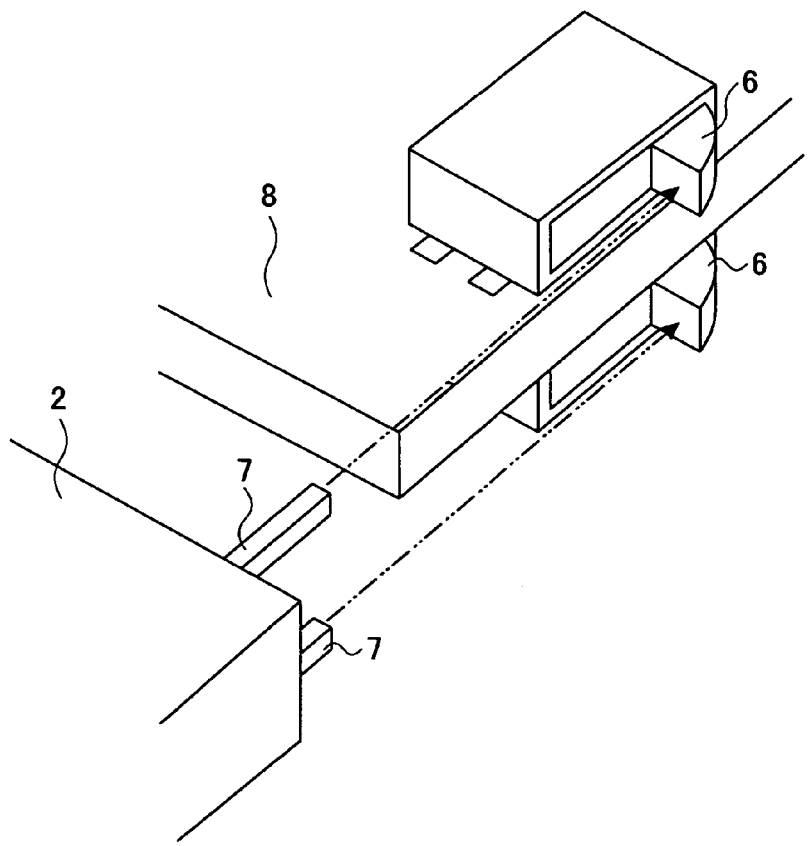
FIG. 3 is a perspective view of a part of an optical disk apparatus according to a first embodiment of the present invention.

FIG. 3 is a perspective view of a part of an optical disk apparatus according to a first embodiment of the present invention. In the first embodiment, a plurality of drawer member detection switches 6 (two switches in FIG. 3) are mounted to the circuit board 8 in the structures shown in FIG. 1 and FIG. 2. The two drawer member detection switches 6 are mounted on opposite sides, respectively, so that the switches 6 faces each other or opposite to each other with the circuit board 8 located therebetween. Two operation members 7 for operating the respective drawer member detection switches 6 are provided at positions in the drawer member 2 where the operation members 7 face the respective drawer member detection switches 6 so that the drawer member detection switches 6 can be pressed by the operation members 7, respectively. According to the above-mentioned structure, the limited mounting area of the circuit board 8 can be used efficiently.

Figure 4:
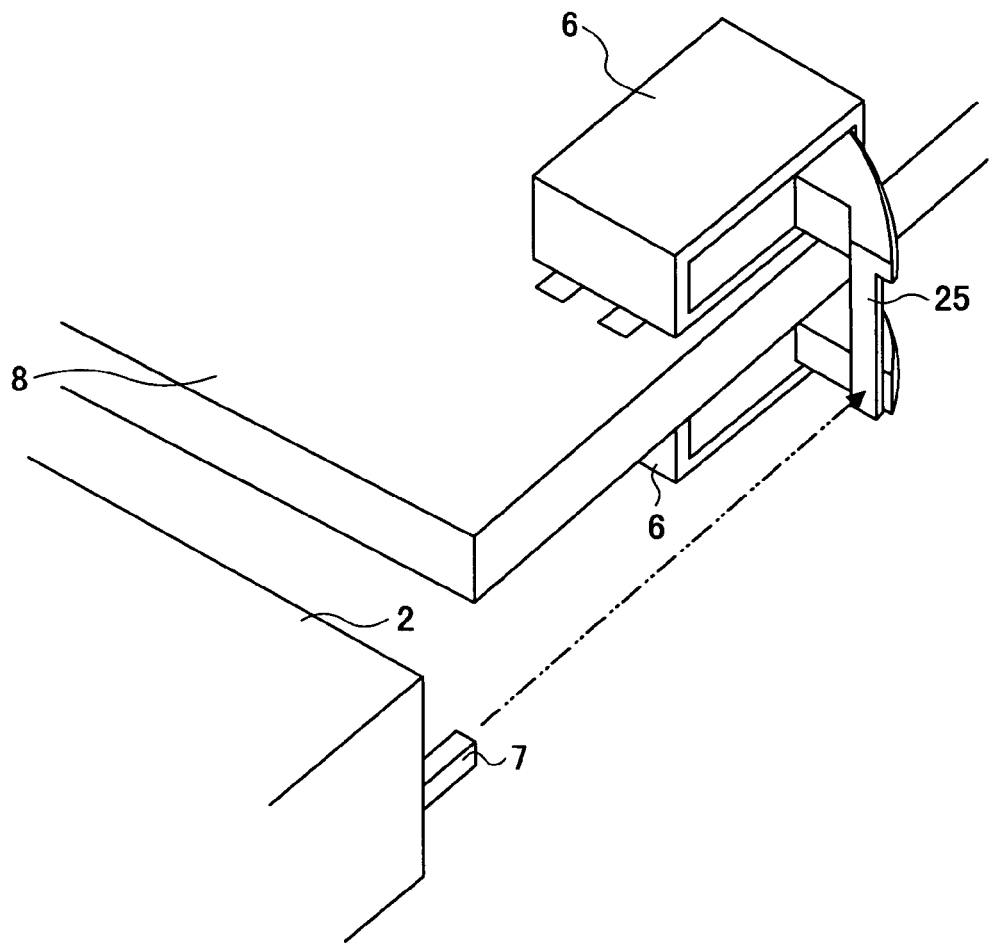
FIG. 4 is a perspective view of a part of an optical disk apparatus according to a second embodiment of the present invention.

FIG. 4 is a perspective view of a part of an optical disk apparatus according to a first embodiment of the present invention. Although the operation members 7 are provided with respect to the drawer member detection switches 6 on one-to-one basis, a coupling member 25, which couples the two drawer member detection switches 6, is provided so as to interlock the operations of the two switches 6 with each other. In this embodiment, only one operation member 7, which operates the drawer member detection switches 6, is located at a position where one of the drawer member detection switches 6 can be pressed or a position where the coupling member 25 can be pressed.

According to the above-mentioned structure, by pressing one of the drawer member detection switches 6 or pressing the coupling member 25, the other one of the drawer member detection switches 6 can be pressed, which results in miniaturization and simplification of the mechanism to operate the drawer member detection switches 6.

Figure 5:
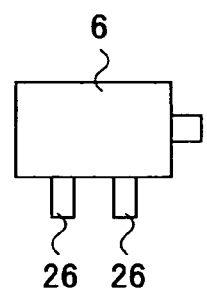
FIG. 5 is a front view of a drawer member detection switch.
Figure 6:
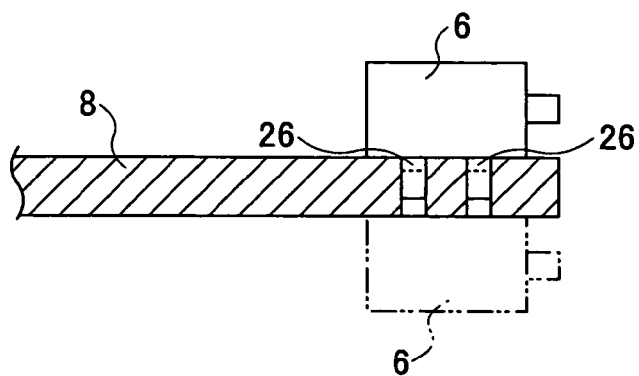
FIG. 6 is a cross-sectional view of a circuit board for explaining a problem that occurs when two identical switches having positioning pins are mounted on a circuit board.
Figure 7A:
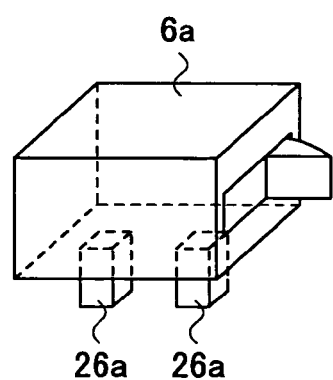
FIG. 7A is a perspective view of one of switches mounted to a circuit board.
Figure 7B:
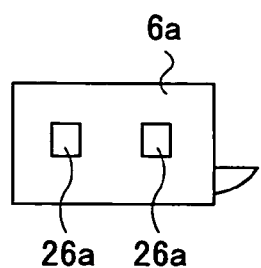
FIG. 7B is a bottom view of the switch shown in FIG. 7A.
Figure 8A:
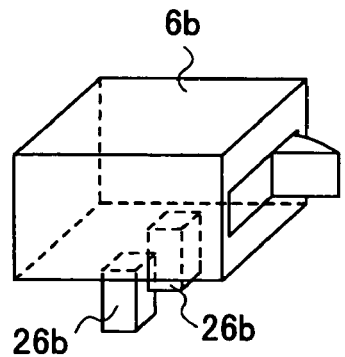
FIG. 8A is a perspective view of the other one of the switches mounted to the circuit board.
Figure 8B:
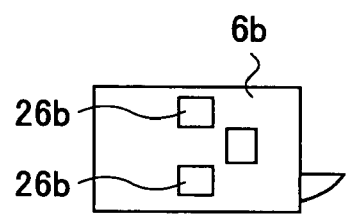
FIG. 8B is a bottom view of the switch shown in FIG. 8A.

Here, generally, as shown in FIG. 5, a switch component adopted as the drawer member detection switch 6 is provided with positioning pins 26 on the bottom surface thereof. The positioning pins 26 are used for positioning and fixing the drawer member detection switch 6 on the circuit board 8. However, since the drawer member detection switches 6 are arranged on both sides of the circuit board 8 facing each other with the circuit board 8 located therebetween, the positioning pins 26 interfere with each other when they are mounted on the circuit board 8 if the thickness of the circuit board 8 is thin.

In order to solve such a problem, each of the drawer member detection switches 6a and 6b of the present embodiment has positioning pins 26a and 26b provided at different positions from each other, as shown in FIGS. 7A and 7B and FIGS. 8A and 8B. That is, for example, the drawer member detection switch 6a shown in FIGS. 7A and 7B has tow positioning pins 26a, while the drawer member detection switch 6b shown in FIGS. 8A and 8B has tow positioning pins 26b arranged in a direction 90 degrees different from a direction of arrangement of the two positioning pins 26a.

Figure 9:
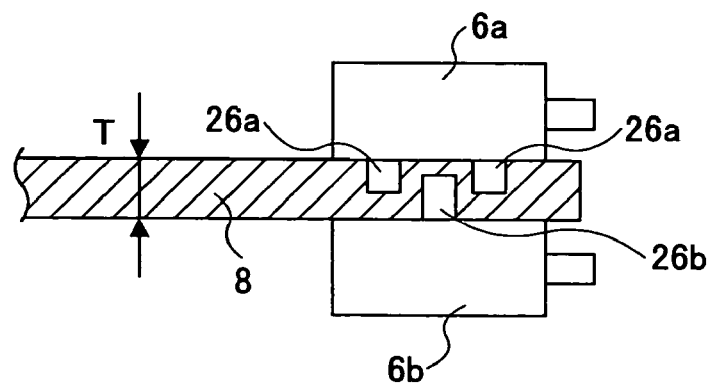
FIG. 9 is a cross-sectional view of the circuit board on which the switches shown in FIGS. 7A and 7B and FIGS. 8A and 8B are mounted.

Accordingly, as shown in FIG. 9, even if the thickness T of the circuit board 8 is smaller than a sum of a length of the positioning pin 26a and a length of the positioning pin 26b, the drawer member detection switches 6a and 6b can be mounted to the circuit board 8 without interference between the positioning pins 26a and 26b.

Figure 10:
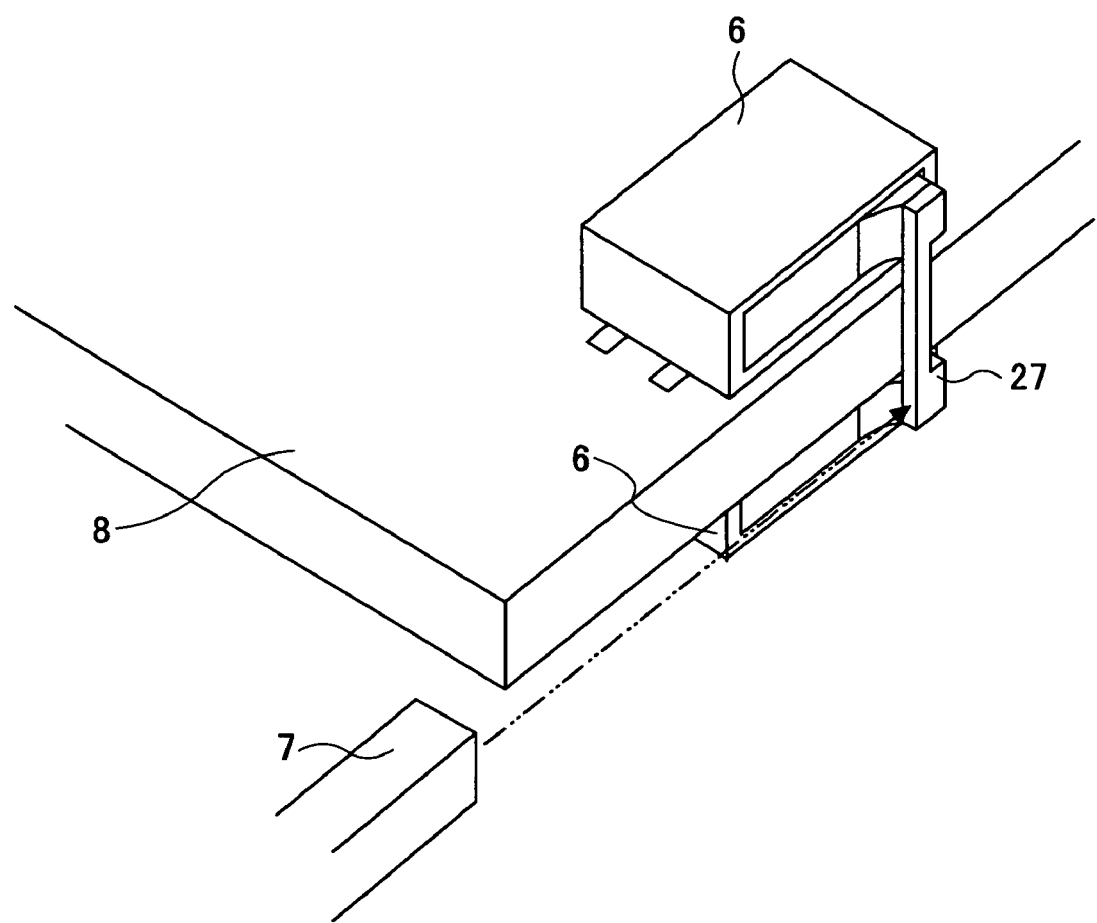
FIG. 10 is a perspective view for explaining a problem that may occur in a pressing operation of an operation member.

When the drawer member detection switches 6 are connected by a coupling member 27 as shown in FIG. 10 so that the pair of switches are operated in an interlocked manner, the operation member 7 for operating the drawer member detection switches 6 is located so as to protrude from a side edge of the circuit board 8. According to such a structure, the operation member 7 moves along the side edge of the circuit board 8. Accordingly if the operation member 7 inclines with respect to the side edge of the circuit board 8, the operation member 7 may contact the side edge of the circuit board 8 before contacting the coupling member 27. Or, if the position of the operation member 7 cannot be accurately set due to accumulated tolerances in dimensions of components parts, the operation member 7 may contact the circuit board 8 when the operation member moves toward the coupling member 27.

Figure 11:
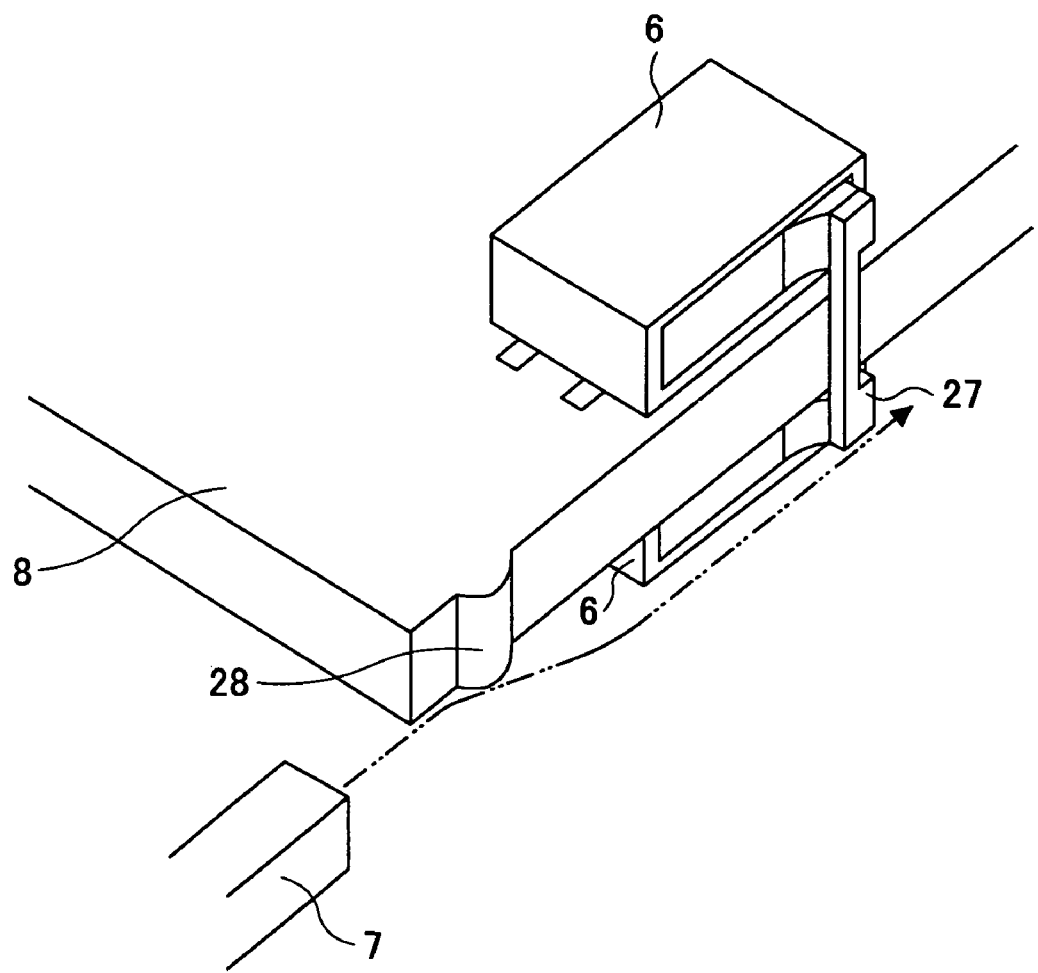
FIG. 11 is a part of an optical disk apparatus according to a third embodiment of the present invention.

Thus, in an optical disk apparatus according to a third embodiment of the present invention shown in FIG. 11, a guiding projection part 28 is provided in the cabinet member 1. Specifically, in FIG. 11, the guiding projection part 28 having a generally round shape is formed on a side edge of the circuit board 8. The guiding projection part 28 causes the operation member 7 to move in an accurate direction toward the coupling member 27 even if the operation member 7 has a tendency to approach and contact the side edge of the circuit board 8. Thus, the drawer member detection switches 6 or the coupling member 27 can be pressed surely by the operation member 7 being guided by the guiding projection part 28.

It should be noted that FIGS. 10 and 11 show a state where the coupling member 27 is completely pressed by the operation member 7 and the drawer member detection switches 6 are in an operated (pressed) state.

The present invention is not limited to the specifically disclosed embodiments, and variations and modifications may be made without departing from the scope of the present invention.

The present application is based on Japanese priority application No. 2003-017536 filed Jan. 27, 2003, the entire contents of which are herein incorporated by reference.

What is claimed is:

1. An optical disk apparatus for recording and/or reproducing information on an optical disk by irradiating a laser beam onto the optical disk, the optical disk apparatus comprising:

a cabinet member that accommodates component parts of said optical disk apparatus including a circuit board having control circuits that control various functions of said optical disk apparatus;

a drawer member having a placement part on which the optical disk is placed, the drawer member being movable between an accommodated position where said drawer member is accommodated in said cabinet member and a non-accommodated position where said drawer member is out of said cabinet member;

an optical pickup mounted on said drawer member so as to emit the laser beam toward the optical disk placed on said placement part; and a plurality of drawer member detection switches each of which detects a position of said drawer member, the drawer member detection switches being arranged on opposite sides of said circuit board in a state where the drawer member detection switches face each other with said circuit board located therebetween.

2. The optical disk apparatus as claimed in claim 1, wherein a coupling member is connected to both said drawer member detection switches arranged opposite to each other with said circuit board therebetween so as to interlock switching operations of said drawer member detection switches with each other.

3. The optical disk apparatus as claimed in claim 2, wherein said drawer member has an operation member that presses said coupling member when said drawer member moves to said accommodated position.

4. The optical disk apparatus as claimed in claim 3, wherein a guiding part is provided in said cabinet member so as to guide a movement of said operation member.

5. The optical disk apparatus as claimed in claim 4, wherein said guiding part is a protrusion formed on a side edge of said circuit board.

6. The optical disk apparatus as claimed in claim 1, wherein each of said drawer member detection switches has at least one positioning pin that protrudes from a surface facing said circuit board, and the positioning pin of one of said drawer member detection switches opposite to each other with said circuit board located therebetween is located at a position different from a position of the positioning pin of the other one of said drawer member detection switches opposite to each other with said circuit board located therebetween.

7. The optical disk apparatus as claimed in claim 6, wherein a coupling member is connected to both said drawer member detection switches arranged opposite to each other with said circuit board therebetween so as to interlock switching operations of said drawer member detection switches with each other.

8. The optical disk apparatus as claimed in claim 7, wherein said drawer member has an operation member that presses said coupling member when said drawer member moves to said accommodated position.

9. The optical disk apparatus as claimed in claim 8, wherein a guiding part is provided in said cabinet member so as to guide a movement of said operation member.

10. The optical disk apparatus as claimed in claim 9, wherein said guiding part is a protrusion formed on a side edge of said circuit board.

* * * * *